US006237527B1

(12) United States Patent
Kellerman et al.

(10) Patent No.: US 6,237,527 B1
(45) Date of Patent: May 29, 2001

(54) SYSTEM FOR IMPROVING ENERGY PURITY AND IMPLANT CONSISTENCY, AND FOR MINIMIZING CHARGE ACCUMULATION OF AN IMPLANTED SUBSTRATE

(75) Inventors: Peter L. Kellerman, Essex; James D. Bernstein, Beverly; A. Stuart Denholm, Lincoln, all of MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/369,560

(22) Filed: Aug. 6, 1999

(51) Int. Cl.[7] .................................................... C23C 16/00
(52) U.S. Cl. .................................. 118/723 E; 118/723 R; 118/728
(58) Field of Search .......................... 118/723 R, 723 E, 118/723 ER, 723 MW, 723 MR, 723 MA, 723 ME, 723 I, 723 IR, 723 AN, 728; 156/345; 315/111.21, 111.31, 111.41, 111.51

(56) References Cited

U.S. PATENT DOCUMENTS

| | | | |
|---|---|---|---|
| 4,438,315 | * 3/1984 | Toyoda et al. | 219/121 PE |
| 4,912,065 | 3/1990 | Mizuno et al. | 437/141 |
| 4,937,205 | 6/1990 | Nakayama et al. | 437/165 |
| 5,110,437 | * 5/1992 | Yamada et al. | 204/298.33 |
| 5,573,597 | * 11/1996 | Lantsman | 118/723 MP |
| 5,585,012 | * 12/1996 | Wu et al. | 216/71 |
| 5,654,043 | 8/1997 | Shao et al. | 427/527 |
| 5,674,321 | 10/1997 | Pu et al. | 118/723 MR |
| 5,690,781 | 11/1997 | Yoshida et al. | 156/345 |
| 5,711,812 | 1/1998 | Chapek et al. | 118/723 E |
| 5,717,294 | 2/1998 | Sakai et al. | 315/111.41 |
| 6,070,550 | * 6/2000 | Ravi et al. | 118/723 E |

* cited by examiner

Primary Examiner—Gregory Mills
Assistant Examiner—Luz L. Alejandro
(74) Attorney, Agent, or Firm—John A. Kastelic

(57) ABSTRACT

A plasma immersion ion implantation method and system is provided for maintaining uniformity in implant energy distribution and for minimizing charge accumulation of an implanted substrate such as a wafer. A voltage modulator (27) applies a pulsed voltage signal ($-V_p$) to a platen (14) in a process chamber (17) containing a plasma, so that ions in the plasma are attracted by and implanted into a wafer residing on the platen. The voltage modulator (27) comprises: (i) a first switch (50) disposed between a power supply (48) and the platen for momentarily establishing a connection therebetween and supplying the pulsed voltage signal to the platen; (ii) a second switch (54) disposed between the platen (14) and ground for at least momentarily closing to discharge residual voltage ($-V_r$) from the platen after the first switch (50) opens and the connection between the power supply and the platen is broken; and (iii) a controller (56) for controlling sequential operation of the switches (50, 54). By closing second switch (54) and grounding the platen, (a) only ions within a certain energy level range are implanted into the wafer, improving the implant energy distribution and (b) wafer charging due to implantation of positive ions is neutralized by allowing electrons in the plasma to flow toward the wafer between implant pulses. Upon opening, second switch (54) permits the platen to float to achieve the floating potential of the plasma thus minimizing voltage stresses on devices in the wafer. Alternatively, the platen may be positively biased to the plasma floating potential.

6 Claims, 2 Drawing Sheets

SYSTEM FOR IMPROVING ENERGY PURITY AND IMPLANT CONSISTENCY, AND FOR MINIMIZING CHARGE ACCUMULATION OF AN IMPLANTED SUBSTRATE

RELATED APPLICATION

The following U.S. patent application is incorporated by reference herein as if it had been fully set forth: application Ser. No. 09/369,528, filed on Aug. 6, 1999, entitled System and Method for Providing Implant Dose Uniformity Across the Surface of a Substrate.

FIELD OF THE INVENTION

The present invention relates generally to the field of plasma immersion ion implantation systems, and more specifically to an improved system and method for maintaining uniform implant energy distribution and minimizing charge accumulation of a substrate implanted by such a system.

BACKGROUND OF THE INVENTION

Ion implantation has become the technology preferred by industry to dope semiconductors with impurities in the large-scale manufacture of integrated circuits. Ion dose is one of two important variables in defining a particular implant process (the other being ion energy, which determines implant depth). Ion dose relates to the concentration of implanted ions for a given area or volume of semiconductor material. Typically, high current implanters (generally greater than 1 milliamp (mA) ion beam current) are used for high dose implants, while medium current implanters (generally capable of up to about 1 mA beam current) are used for lower dose applications.

A conventional ion implanter comprises three sections or subsystems: (i) an ion source for outputting an ion beam, (ii) a beamline including a mass analysis magnet for mass resolving the ion beam, and (iii) a target chamber which contains the semiconductor wafer or other substrate to be implanted by the ion beam. Ion sources in ion implanters typically generate an ion beam by ionizing within a source chamber a source gas, a component of which is a desired dopant element, and extracting the ionized source gas in the form of an ion beam. The ion beam is directed along an evacuated beam path provided by the beamline. Energetic ions within the beam strike the substrate within the target chamber and are implanted therein. It is important in such an implantation system to insure that the implanted ions do not charge the surface of the wafer to such an extent that circuit components on the wafer are damaged. To prevent such detrimental effects of wafer charge accumulation, beam neutralization mechanisms are often implemented in an ion implanter. In addition, the energy of the implanted ions must be controlled in order to assure a uniform and desired energy distribution for the implant.

Plasma immersion ion implantation (PI-cubed or PI$^3$) is an emerging technology wherein a substrate such as a wafer on a platen is immersed within a plasma in a chamber. Thus, the chamber functions as both the processing chamber and the plasma source. Typically, a voltage differential is periodically established between the walls of the chamber and the platen to attract ions in the plasma toward the substrate. A sufficient voltage differential will result in a pulsed ion implantation into the surface of the substrate.

As in conventional ion implantation systems, it is important to insure that wafer charging is minimized. In a PI-cubed system, wafer charging may be caused by either (i) accumulated charge from the implant pulses or (ii) exposure to the plasma in the chamber between implant pulses. In addition, as in conventional ion implantation systems, it is important to insure that only ions within a specific energy range are implanted into the wafer to yield a uniform implant energy distribution.

Accordingly, it is an object of the present invention to provide a system and method for maintaining a uniform implant energy distribution and for minimizing charge accumulation of a substrate implanted by a plasma immersion ion implantation system.

SUMMARY OF THE INVENTION

A plasma immersion ion implantation method and system is provided for maintaining uniformity in implant energy distribution and for minimizing charge accumulation of an implanted substrate such as a wafer. An improved voltage modulator applies a pulsed voltage signal to a platen in a process chamber that contains a plasma, so that ions in the plasma are attracted by and implanted into a wafer residing on the platen. The voltage modulator comprises: (i) a first switch disposed between a power supply and the platen for momentarily establishing a connection therebetween and supplying the pulsed voltage signal to the platen; (ii) a second switch disposed between the platen and ground for at least momentarily closing to discharge residual voltage from the platen after the first switch opens and the connection between the power supply and the platen is broken; and (iii) a controller for controlling sequential operation of the first and second switches.

By closing second switch and grounding the platen the number of ions with energy less than the applied pulse voltage are reduced, thus improving the implant energy distribution. Further, wafer charging due to implantation of positive ions is neutralized by allowing electrons in the plasma to flow toward the wafer between implant pulses. Upon opening, second switch permits the platen to float to achieve the floating potential of the plasma, thus minimizing voltage stresses on devices in the wafer. Alternatively, the platen may be positively biased to the plasma floating potential.

DETAILED DESCRIPTION OF A PREFERRED EMBODIMENT

Figure 1:
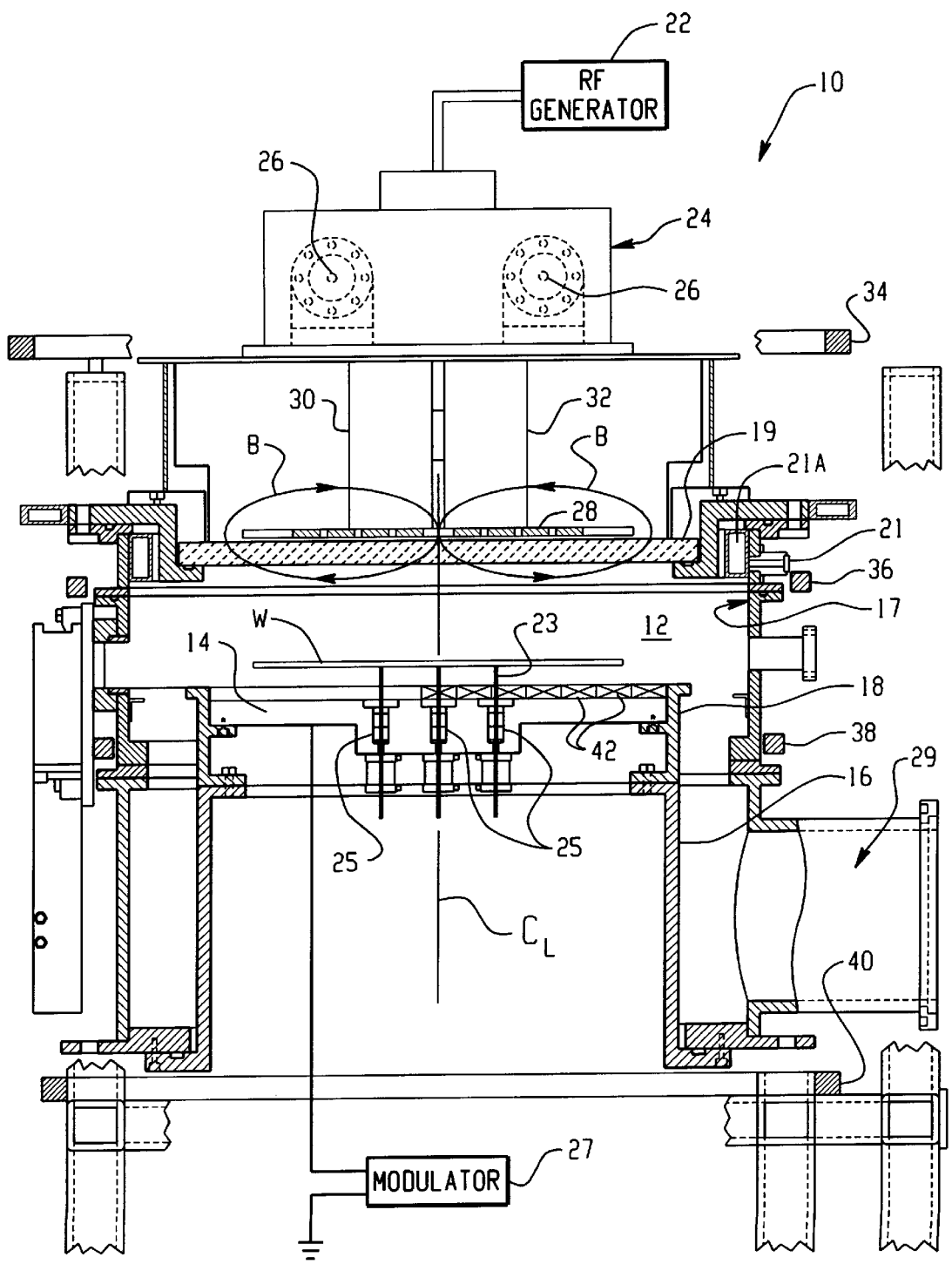
FIG. 1 is a cross sectional plan view of a plasma immersion ion implantation system into which is incorporated one embodiment of a modulator switching mechanism constructed according to the principles of the present invention.

Referring now to the drawings, FIG. 1 discloses a plasma immersion ion implantation system, generally designated 10. The system 10 includes an evacuated process chamber 12 that is defined by an electrically activatable wafer support platen 14 mounted on insulator 18, an electrically grounded chamber housing 16 having walls 17, and a quartz window 19. Plasma generated within the chamber contains ions of a desired dopant species (e.g., arsenic) that are implanted into a substrate, such as a semiconductor wafer W located therein, when an negatively charged voltage is applied to the platen 14. As shown in FIG. 1, the wafer W is lifted off of the platen by pins 23 operated by pin assemblies 25. In this manner the wafer may be readily installed into and removed from the plasma chamber via a loadlock assembly (not shown).

The plasma is generated in the process chamber 12 as follows. An ionizable dopant gas is introduced into the process chamber 12 by means of inlet 21 and perforated annular channel 21A that resides about the upper periphery of the chamber. A radio frequency (RF) generator 22 generates an RF signal (on the order of 13.5 megahertz (MHz)) which is coupled to a matching network 24. The matching network includes capacitors 26 that capacitively couple the RF signal to a generally planar antenna 28, having inner and outer circular coils, via leads 30 and 32. Matching the impedance of the RF generator 22 with that of the load insures maximum power out of the antenna 28 by minimizing reflection of the RF signal back into the generator. One such type of matching network 24 is known as an "inverted L" network wherein the capacitance of capacitors 26 is varied by servomotors, depending upon operating conditions.

The RF current generated within the antenna 28 creates a magnetic field that passes through the quartz window 19 into the process chamber 12. The magnetic field lines are oriented in the direction shown by arrows B, based on the direction of current through the antenna coils. The magnetic field penetrating the process chamber 12 through the quartz window 19 induces an electric field in the process chamber. This electric field accelerates electrons, which in turn ionize the dopant gas, which is introduced into the chamber through annular channel 21A, to create a plasma. The plasma includes positively charged ions of the desired dopant that are capable of being implanted into wafer W when a suitable opposing voltage is applied to platen 14 by modulator 27. Because the implantation process occurs in a vacuum, the process chamber 12 is evacuated by pumps (not shown) via pump manifold 29.

Electromagnetic coils 34, 36 38 and 40 are located outside of the process chamber 12. The purpose of the coils is to vary the magnetic field within the process chamber 12 to effectively vary the plasma diffusion rate, which varies the radial distribution of plasma density across the surface of the wafer, to insure a uniform implant across the surface of the wafer. In the preferred embodiment, the electromagnetic coils include two larger main coils 34 and 40 disposed above and below, respectively, two smaller trim coils 36 and 38, which reside closer in proximity to the process chamber 12. In addition, the wafer platen 14 includes a dosimetry detector such as a plurality of Faraday current collectors or cups 42 that are used to measure plasma current density and thereby provide an indication of implant dose.

Figure 2:
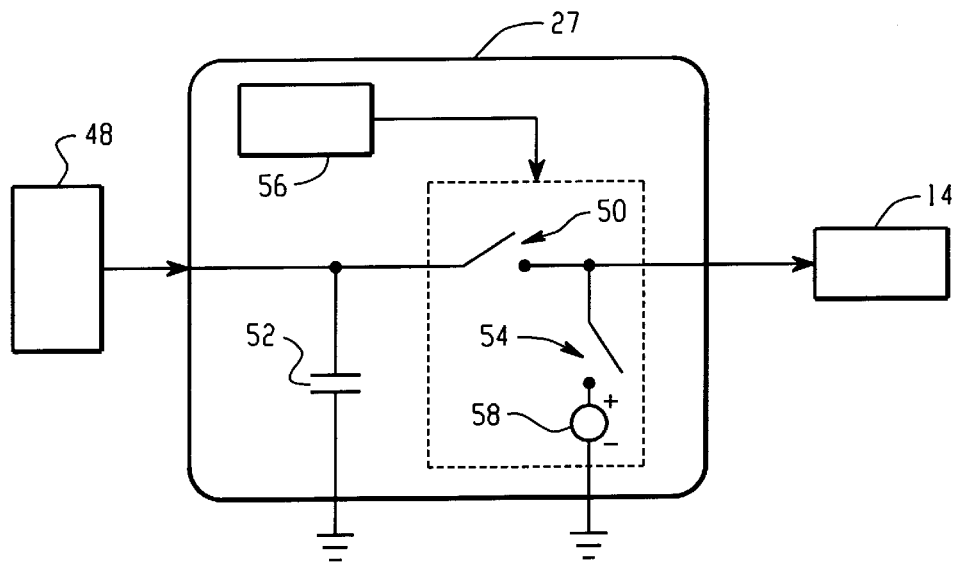
FIG. 2 is a block diagram of a platen voltage controller that includes the modulator switching mechanism shown in FIG. 1.

The present invention is implemented in the form of an improved modulator 27 that includes a mechanism for controlling the voltage applied to the wafer platen 14. As shown in FIG. 2, the platen voltage-controlling mechanism includes the modulator 27 and a high voltage power supply 48. Switch 50 is used to periodically apply or pulse a high voltage to the platen 14 to enable implantation of positively charged ions in the plasma into a wafer W residing on the platen. Capacitor 52 installed between earth ground and the power supply 48 serves as a buffer to suppress power supply voltage spikes.

Switch 54 is connected between the platen 14 and a lesser potential (in this case earth ground) and used to limit the voltage applied to the platen 14 after switch 50 opens. In this embodiment of the invention, platen bias voltage supply 58, the purpose of which will be disclosed later, is not used and the switch 54 is connected directly between earth ground and the platen. Switches 50 and 54 are preferably high-voltage IGBT-type switches that are operated by controller 56. Controller 56 may also be used to control the voltage output by power supply 48. As will be explained further below, switch 54 functions (opens and closes) in a carefully controlled sequential manner to both (i) insure a uniform implant energy distribution and (ii) minimize the charge accumulation of a substrate implanted by the system 10.

Figure 3:
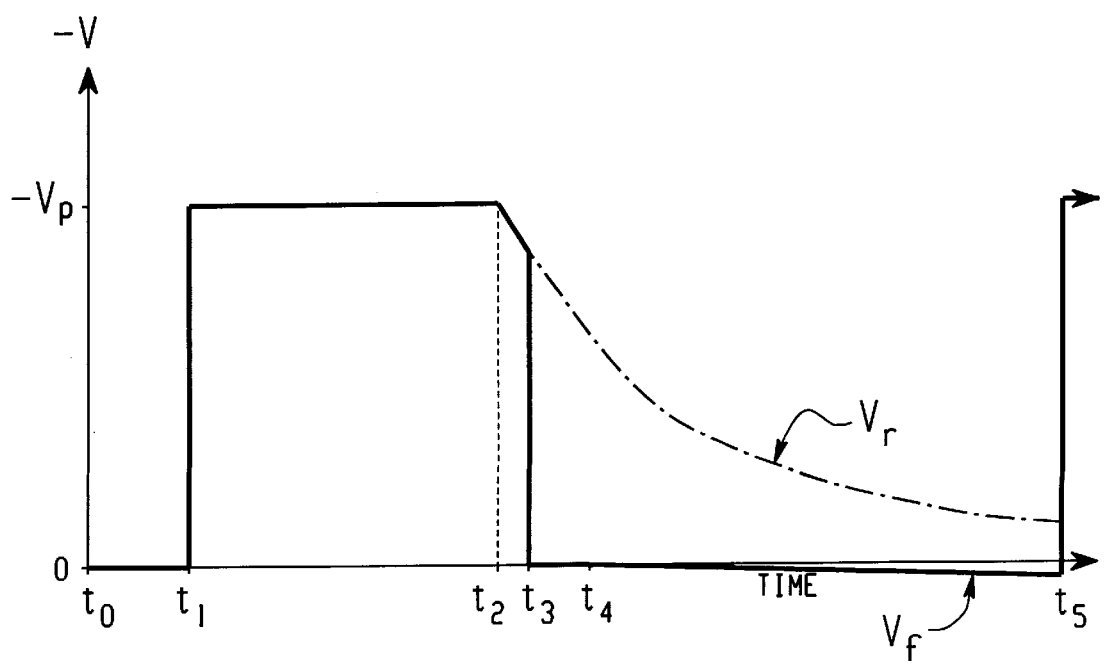
FIG. 3 is a graphical representation of the platen voltage as a function of time, shown both with and without the modulator switching mechanism of the present invention.

FIG. 3 shows the voltage that is applied to the platen 14 both with (solid lines) and without (phantom lines) the switch 54 installed in the modulator circuit. The voltage $-V_p$ applied to the platen is on the order of $-.5$ kilovolts (kV) to $-10$ kV in the present system and is applied to the platen at time $t_1$. During the time from $t_1$ to $t_2$, a time period of approximately 4 microseconds ($\mu$sec), the negative voltage applied to the platen attracts positive ions from the plasma in the chamber 17 and implants them into the wafer W. At time $t_2$, switch 50 opens and the voltage is no longer actively applied to the platen by power supply 48.

If the switch 54 is not implemented in the modulator 27 (such as in a prior art system), the negative residual voltage $-V_r$ gradually dissipates until the next implant cycle is reached at time $t_5$, at which time the high voltage $-V_p$ is again applied to the platen by switch 50. During the interval between times $t_2$ and $t_5$, the residual negative voltage $-V_r$ will continue to attract and implant positive ions into the wafer, although at gradually lesser energies (and hence depths) than are applied at voltage $-V_p$. The residual negative voltage $-V_r$ is represented in FIG. 3 as a dotted line. The rate at which this negative residual voltage dissipates depends on plasma density. Thus to insure consistent implant energy distributions, consistently equal plasma densities would be required for each implant. It would be advantageous to remove this dependency, so that the plasma density could be adjusted (e.g. to achieve different dose rates) without affecting the implant energy distribution.

A residual voltage having a long fall time causes an energy spread in the ions that are implanted in the wafer. Immediately after switch 50 opens, the voltage on the platen begins to fall, eventually collapsing the plasma sheath in the chamber 17 that provides ions capable of being implanted into the wafer. For example, for a plasma having an ion density of $10^{10}/cm^3$, and a 5 $\mu$sec voltage pulse $-V_p$ of $-5$ kV, the minimum time for sheath collapse is 6 $\mu$sec, so implantation may occur for up to 6 $\mu$sec after the switch 50 opens. If the fall time of the residual voltage $-V_r$ is more than 6 $\mu$sec, substantial energy spread occurs. Specifically, it has been found that for a $-5$ kV pulse having a fall time of 20 $\mu$sec, only about 25% of the implanted ions are implanted at voltage $-V_p$. As a result of this extended fall time, the resulting plasma energy distribution is non-uniform.

If the switch 54 of the present invention is installed in the modulator 27, however, it is closed at time $t_3$, approximately 1 $\mu$sec after switch 50 opens, thereby insuring a rapid fall time for the voltage pulse $-V_p$. Immediately after switch 54 closes, the residual voltage on the platen is grounded and the implantation process stops, thereby minimizing ion energy spread in the implant. Furthermore, the energy spread will be independent of plasma conditions, such as plasma density.

In addition to improving the implant energy distribution, the switch 54 is also used to reduce wafer charging that might otherwise damage circuitry thereon. Wafer charging occurs by two mechanisms. If there are insulated structures on the wafer substrate, the ions in the plasma that are implanted into the insulated layer of the wafer, which are positively charged, positively charge this layer. If this charged insulated layer is not neutralized, the charge could eventually accumulate to such an extent that wafer circuitry is damaged by the potential difference between the insulated wafer and the substrate.

The grounding of the platen by switch 54 upon conclusion of implant pulse $-V_p$ neutralizes the wafer substrate. When switch 54 is closed to ground the platen, electrons in the plasma are attracted to and neutralize the positively charged insulated layer of the wafer. In this manner, between each implantation pulse, wafer charging from the pulse is neutralized. If the switch 54 were not present, as in the prior art, the residual negative voltage $-V_r$ would repel the plasma electrons, thereby preventing wafer surface charge neutralization.

The second mechanism by which wafer charging occurs is by the plasma that surrounds the wafer W in the chamber 17, which is generally positively charged to approximately +10 to +20 volts (known as the plasma potential). The plasma will charge the insulating surface of the wafer to the plasma floating potential, and if the platen 14 (and therefore the wafer substrate) remains grounded by switch 54, a potential difference is created between the insulating layer and the substrate. To prevent such plasma-induced voltage stress on the insulating layer, switch 54 is opened at time $t_4$ to allow the platen to float to the plasma floating potential $V_f$ (approximately 0 to +20 volts), at which time the plasma-platen voltage differential is eliminated to prevent damage to the wafer circuitry. The momentary time period during which the switch 54 is closed ($t_4-t_3$) is approximately 1 to 2 $\mu$sec.

Alternatively, to prevent this second mechanism of plasma-induced wafer charging, instead of allowing the platen 14 to float to the plasma floating potential upon opening of switch 54, the voltage of the platen may be forced positive to the plasma floating potential 0 to +20 volts). The switch 54 and the platen bias voltage supply 58 (see FIG. 2) may be used for this purpose. By positively biasing the platen by closing switch 54 at time $t_3$, after switch 50 has been opened at time $t_2$, wafer charging due to the plasma potential may be minimized. In this case, the switch 54 will remain closed for more than the momentary ($t_4-t_3$) grounding application described immediately above. Preferably, the switch 54 will remain closed, thereby biasing the platen 14 to the plasma voltage, until just prior to the next implant pulse beginning at time $t_5$.

The present invention thereby serves two purposes in a pulsed plasma immersion ion implantation system. First, by grounding the wafer platen after the implant pulse, the residual voltage tail $-V_r$ is clipped, thereby insuring that most of the ions implanted are at energy level corresponding to the implant voltage pulse $-V_p$. In this manner, the energy purity of the implant is significantly improved. Second, by only temporarily grounding the wafer platen, followed by either allowing the platen to float to the plasma floating potential or by forcing the platen to the plasma floating potential, wafer charging due to both implanted ions and the plasma potential is minimized.

Accordingly, a preferred embodiment has been described for a method and system for maintaining a uniform implant energy distribution and for minimizing charge accumulation of a substrate implanted by a plasma immersion ion implantation system. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. In a pulsed plasma immersion ion implanter system (10) having a process chamber (17) for implanting substrates (W) positioned on a platen (14) contained therein with ions present in a plasma generated therein, the system comprising a voltage modulator (27) having:

(i) a first switch (50) disposed between a power supply (48) and the platen (14) for momentarily establishing a connection between the power supply and the platen and supplying a pulsed voltage signal ($-V_p$) to the platen;

(ii) a second switch (54) disposed between the platen (14) and a lesser potential for at least momentarily closing to discharge residual voltage ($-V_r$) from the platen after said first switch (50) opens and said connection between the power supply and the platen is broken;

(iii) a controller (56) for controlling sequential operation of said first and second switches (50, 54); and (iv) a second power supply (58), wherein said second switch (54) applies a bias voltage provided by said second power supply to the platen (14) after said first switch opens and said second switch is connected to said second power supply.

2. The system (10) of claim 1, wherein said bias voltage is approximately the voltage of the plasma.

3. The system (10) of claim 2, wherein said bias voltage is between 0 volts and +20 volts.

4. A plasma immersion ion implantation system (10), comprising:

(i) a process chamber (17) for implanting substrates (W) positioned on a platen (14) contained therein, with ions present in a plasma generated therein, (ii) a power supply (48) for supplying a pulsed voltage signal ($-V_p$) to said platen (14);

(iii) a first switch (50) disposed between said power supply (48) and said platen (14) for momentarily establishing a connection between the power supply and the platen to supply said pulsed voltage signal ($-V_p$) to the platen;

(iv) a second switch (54) disposed between said platen (14) and a lesser potential for at least momentarily closing to discharge residual voltage ($-V_r$) from the platen after said first switch (50) opens and said connection between the power supply and the platen is broken;

(v) a controller (56) for controlling sequential operation of said first and second switches (50, 54); and (vi) a second power supply (58), wherein said second switch (54) applies a bias voltage provided by said second power supply to the platen (14) after said first switch opens and said second switch is connected to said second power supply.

5. The system (10) of claim 4, wherein said bias voltage is approximately the voltage of the plasma.

6. The system (10) of claim 5, wherein said bias voltage is between 0 volts and +20 volts.

* * * * *